(12) United States Patent
Lu et al.

(10) Patent No.: US 12,413,215 B2
(45) Date of Patent: Sep. 9, 2025

(54) COMMON MODE TERMINATION MATCHING METHOD FOR DIGITAL COMMUNICATIONS

(71) Applicant: Rockwell Automation Technologies, Inc., Mayfield Heights, OH (US)

(72) Inventors: Haihui Lu, Shanghai (CN); David D. Brandt, New Berlin, WI (US); Caleb J. Palagyi, Sagamore Hills, OH (US); Joseph M. Futey, Seven Hills, OH (US); Brian R. Campbell, Brecksville, OH (US); Neal R. Krejci, Seven Hills, OH (US); Zhijie Gong, Shanghai (CN)

( * ) Notice: Subject to any disclaimer, the term of this patent is extended or adjusted under 35 U.S.C. 154(b) by 0 days.

(21) Appl. No.: 18/434,480

(22) Filed: Feb. 6, 2024

(65) Prior Publication Data

US 2025/0253835 A1    Aug. 7, 2025

(51) Int. Cl.
*H03K 5/1252* (2006.01)
*H02H 9/00* (2006.01)

(52) U.S. Cl.
CPC ........... *H03K 5/1252* (2013.01); *H02H 9/005* (2013.01)

(58) Field of Classification Search
CPC ........ H03K 5/1252; H02H 1/00; H02H 1/003; H02H 1/04; H02H 1/043; H02H 1/046; H02H 7/003; H02H 7/00; H02H 7/005; H02H 7/008; H02H 7/04; H02H 7/042; H02H 7/045; H02H 7/0455; H02H 7/05; H02H 7/055; H02H 7/08; H02H 7/0805; H02H 7/0811; H02H 7/09; H02H 7/10; H02H 7/103; H02H 7/106; H02H 7/12; H02H 7/16; H02H 7/20; H02H 7/205; H02H 9/00; H02H 9/001; H02H 9/002; H02H 9/004; H02H 9/021; H02H 9/02; H02H 9/025; H02H 9/026; H02H 9/028; H02H 9/04; H02H 9/044; H02H 9/045; H02H 9/046; H02H 9/005
See application file for complete search history.

(56) References Cited

U.S. PATENT DOCUMENTS

2006/0025104 A1*  2/2006  Reed ............... H02M 3/156
                                                         455/343.1

FOREIGN PATENT DOCUMENTS

CN        201629463 U        11/2010
CN        111901012 A        11/2020

OTHER PUBLICATIONS

European Search Report issued by the European Patent Office for European application No. EP 25155737 mailed Jul. 11, 2025, 39 pages.

* cited by examiner

Primary Examiner — Jung Kim

(57) ABSTRACT

A common-mode interference dissipation circuit to provide circuitry immunity to electrical interference, such as common mode impedance interference, is described herein. The common-mode interference dissipation circuit may include one or more variable resistors each having a first terminal and a second terminal and a capacitor coupled in series with the one or more variable resistors and having a first terminal and a second terminal. The first terminal of the one or more variable resistors may be coupled to a port of the first set of ports, the second terminal of the one or more variable resistors may be coupled to the first terminal of the capacitor, and the second terminal of the capacitor may be coupled to a chassis in an industrial automation environment.

20 Claims, 9 Drawing Sheets

COMMON MODE TERMINATION MATCHING METHOD FOR DIGITAL COMMUNICATIONS

RELATED APPLICATIONS

This application is related to U.S. patent application Ser. No. 18/434,439, titled "A CIRCUIT TO IMPROVE ETHERNET IMMUNITY TO ELECTRICAL FAST TRANSIENT", filed concurrently with this application, which is hereby incorporated by reference in its entirety.

TECHNICAL FIELD

Various embodiments of the present technology relate to circuitry immunity to electrical interference, and particularly, to dissipating interference caused by common-mode impedance interference.

BACKGROUND

Electronic equipment and electrical products operating in industrial and commercial environments are subject to standards, requirements, and other compatibility specifications set by the International Electrotechnical Commission (IEC). One standard mandated by the IEC relates to Electrical Fast Transient (EFT) testing. EFT testing is an immunity standard used to test how electronic equipment and electrical products operate under interference. EFT testing may include different tests to determine whether devices and products are compatible with fast transients, such as power line transients and electrostatic discharge. A future requirement under EFT testing includes a 100 kHz EFT test.

In systems involving low-voltage communications, such as communications via Ethernet cabling, solutions include using fixed-value resistors, capacitors, and/or inductors to match an impedance of an interference signal introduced during an EFT test. However, such solutions yield impedance mismatching across different frequency ranges, which may cause noise to disrupt operations of the electrical components of the system and even damage components thereof. Other existing solutions may include transient voltage suppression diodes that may be coupled to ground nodes to dissipate interference introduced during EFT tests. These solutions may also fail to match the impedance of transients in various frequency ranges causing similar issues.

SUMMARY

Systems, devices, and methods are provided herein for improving immunity to electrical interference in circuitry and cabling, and more particularly, to dynamically adjusting interference dissipation components to reduce common-mode impedance interference in a system. An industrial or commercial environment may include various industrial automation devices, such as variable-speed drives, motors, and the like, that perform industrial automation processes. Some of these devices may be coupled together using low-voltage cabling, such as Ethernet cables, to establish communications among each other via a communication network. During operation, interference or noise may be injected to these devices, which may distort signals provided by or provided to the devices, and ultimately, may disrupt functionality or damage components of the devices. One example of such interference may be common-mode impedance interference. As described herein, common-mode interference may be dissipated using an interference dissipation circuit included in devices in the industrial environment. Performance of the interference dissipation circuit may be tuned based on the amount of common-mode impedance interference, or the impedance or frequency of the interference.

In an embodiment of the present technology, a network interface system including a transformer circuit, a physical layer circuit, and a cable side circuit is provided. The transformer circuit includes a plurality of transformer ports, including a first set of transformer ports and a second set of transformer ports. The physical layer circuit is coupled to the transformer circuit at the second set of transformer ports. The cable side circuit is coupled to the transformer circuit at the first set of transformer ports. The cable side circuit includes a connector port, including a receptacle and a set of output ports that couple to a subset of the first set of ports, and a common-mode interference dissipation circuit, including one or more variable resistors each having a first terminal and a second terminal, and a capacitor coupled in series with the one or more variable resistors and having a first terminal and a second terminal. The first terminal of the one or more variable resistors is coupled to a port of the first set of ports, the second terminal of the one or more variable resistors is coupled to the first terminal of the capacitor, and the second terminal of the capacitor is coupled to a chassis in an industrial automation environment.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

While multiple embodiments are disclosed, still other embodiments of the present technology will become apparent to those skilled in the art from the following detailed description, which shows and describes illustrative embodiments of the invention. As will be realized, the technology is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Many aspects of the disclosure can be better understood with reference to the following drawings. The components in the drawings are not necessarily drawn to scale. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

Figure 1:
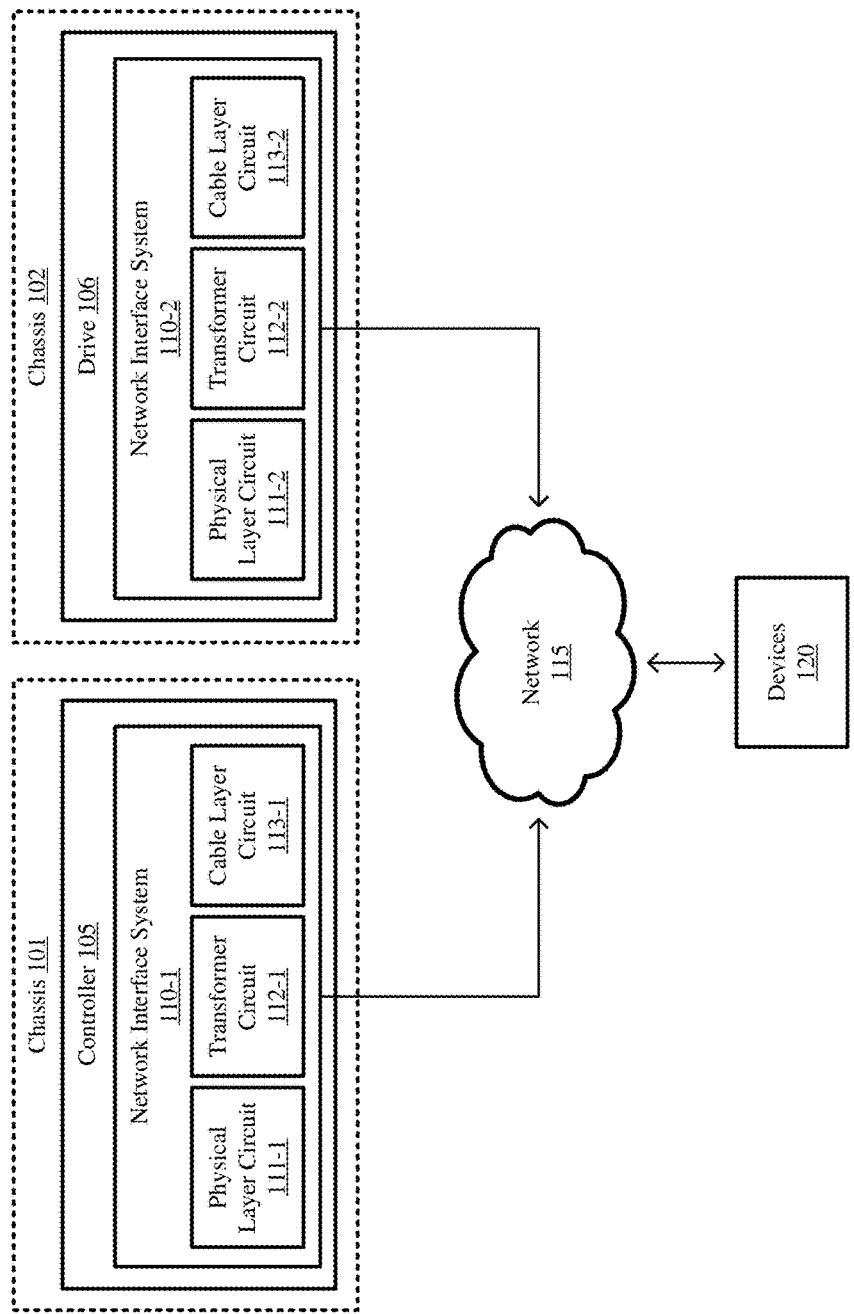
FIG. 1 illustrates an example operating environment in accordance with some embodiments of the present technology.

The drawings have not necessarily been drawn to scale. Similarly, some components or operations may not be separated into different blocks or combined into a single block for the purposes of discussion of some of the embodiments of the present technology. Moreover, while the technology is amendable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology relate to improving immunity to electrical interference in circuitry and cabling. An industrial or commercial environment may include various industrial automation devices, such as variable-speed drives, motors, and the like, that perform industrial automation processes. Some of these devices may be coupled together using low-voltage cabling, such as unshielded Ethernet cables, to establish communications among each other via a communication network. During operation, interference or noise may be injected to these devices, which may distort signals provided by or provided to the devices, and ultimately, may disrupt functionality or damage components of the devices. One example of such interference may be common-mode impedance interference.

To address issues arising from electrical interference, a network interference system may be included in industrial or commercial devices operating in an industrial automation environment to dissipate noise and reduce resonant ringing of the noise. As described herein, common-mode interference may be dissipated using an interference dissipation circuit included in devices in the industrial automation environment. Performance of the interference dissipation circuit may be tuned based on the amount of common-mode impedance interference, or the impedance or frequency of the interference. Accordingly, interference dissipation components of the interface dissipation circuit may be dynamically adjusted to reduce common-mode impedance interference in a system.

In an embodiment of the present technology, a network interface system including a transformer circuit, a physical layer circuit, and a cable side circuit is provided. The transformer circuit includes a plurality of transformer ports, including a first set of transformer ports and a second set of transformer ports. The physical layer circuit is coupled to the transformer circuit at the second set of transformer ports. The cable side circuit is coupled to the transformer circuit at the first set of transformer ports. The cable side circuit includes a connector port, including a receptacle and a set of output ports that couple to a subset of the first set of ports, and a common-mode interference dissipation circuit, including one or more variable resistors each having a first terminal and a second terminal, and a capacitor coupled in series with the one or more variable resistors and having a first terminal and a second terminal. The first terminal of the one or more variable resistors is coupled to a port of the first set of ports, the second terminal of the one or more variable resistors is coupled to the first terminal of the capacitor, and the second terminal of the capacitor is coupled to a chassis in an industrial automation environment.

In another embodiment, an industrial automation system is provided. The industrial automation system includes a network interface component and an industrial automation device coupled to the network interface component. The network interface component includes a transformer circuit, a physical layer circuit, and a cable side circuit is provided. The transformer circuit includes a plurality of transformer ports, including a first set of transformer ports and a second set of transformer ports. The physical layer circuit is coupled to the transformer circuit at the second set of transformer ports. The cable side circuit is coupled to the transformer circuit at the first set of transformer ports. The cable side circuit includes a connector port, including a receptacle and a set of output ports that couple to a subset of the first set of ports, and a common-mode interference dissipation circuit, including one or more variable resistors each having a first terminal and a second terminal, and a capacitor coupled in series with the one or more variable resistors and having a first terminal and a second terminal. The first terminal of the one or more variable resistors is coupled to a port of the first set of ports, the second terminal of the one or more variable resistors is coupled to the first terminal of the capacitor, and the second terminal of the capacitor is coupled to a chassis in an industrial automation environment.

Advantageously, the disclosed system can dynamically provide interference dissipation for types of electrical interference, such as common-mode impedance interference, among several frequency ranges. The components of the system can be manually or automatically adjusted based on an amount of interference identified in signals passing through the system. Accordingly, devices that connect to other devices or system in an industrial automation environment may be capable of passing electrical interference injection tests by dynamically adjusting to match common-mode impedances at terminations within the devices. Not only does the network interface system disclosed herein improve device and system performance in an industrial automation environment by reducing noise and interference that can reach elements of the system, but also it can meet mandated electrical interference requirements.

Turning now to the Figures, FIG. 1 illustrates an example operating environment in accordance with some embodiments of the present technology. FIG. 1 includes operating environment 100, which is representative of an environment in which industrial, commercial, and industrial automation processes, among other processes may be performed. Operating environment 100 includes chassis 101, chassis 102, and devices 120, which each include components connected to network 115. Chassis 101 further includes controller 105 and network interface system 110-1, which includes physical layer circuit 111-1, transformer circuit 112-1, and cable side circuit 113-1. Chassis 102 further includes drive 106 and network interface system 110-2, which includes physical layer circuit 111-2, transformer circuit 112-2, and cable side circuit 113-2.

Chassis 101 and chassis 102 may be representative of structural frameworks, racks, or other support devices that can include internal and external supporting structures on which industrial, commercial, and industrial automation devices can be mounted, attached, placed, or otherwise affixed to. Chassis 101 and chassis 102 can provide protective grounding for electrical signals transmitted to and received from devices in or on chassis 101 and chassis 102, respectively. In this example, chassis 101 may include controller 105, and chassis 102 may include drive 106. In other examples, additional or different devices may be included in either chassis 101 or chassis 102, such as network controllers, logic controllers, I/O modules and adapters, chassis-based communication modules, Ethernet IP adapters, network cards, other networking equipment, and the like.

Controller 105 may be representative of a controller, control device, or control module capable of controlling operations, communications, and other functions of an industrial automation device and communicating with one or more devices, including the industrial automation device, over network 115. In various examples, controller 105 may include one or more processors or processing devices and accompanying circuitry. Examples of the processors include a general processing unit, a central processing unit (CPU), a microcontroller, a programmable logic controller, a digital signal processor, an application-specific integrated circuit (ASIC), field-programmable logic devices, and the like, as well as any combination or variation thereof. For example, controller 105 may be a programmable logic controller (PLC), a network controller, or the like.

Controller 105 may include network interface system 110-1, which includes physical layer circuit 111-1, transformer circuit 112-1, and cable side circuit 113-1. Network interface system 110-1 may be representative of one or more devices, circuits, and components capable of connecting controller 105 to network 115 and protecting controller 105, and an associated industrial automation device, from electrical interference, such as common-mode impedance interference. In various examples, network interface system 110-1 may be implemented in or around a port, coupling, receptacle, or other interface device of controller 105, such as in or around an RJ45 connector of controller 105.

Drive 106 may be representative of an industrial drive capable of driving operations of one or more industrial, commercial, or industrial automation devices in an industrial automation environment. Examples of drive 106 may include a distributed servo drive (DSD) and a distributed servo motor (DSM), among other types of drives.

Drive 106 may include network interface system 110-2, which includes physical layer circuit 111-2, transformer circuit 112-2, and cable side circuit 113-2. Network interface system 110-2, like network interface system 110-1, may be representative of one or more devices, circuits, and components capable of connecting drive 106 to network 115 and protecting drive 106, and one or more associated industrial automation devices, from electrical interference, such as common-mode impedance interference. In various examples, network interface system 110-2 may be implemented in or around a port, coupling, receptacle, or other interface device of drive 106, such as in or around an RJ45 connector of drive 106.

Physical layer circuits 111-1 and 111-2 (collectively physical layer circuits 111) may be representative of circuitry capable of providing a physical layer (PHY) interface between network 115 and components of controller 105 or drive 106. Physical layer circuits 111 may include various electrical and electronic components, such as resistors, capacitors, inductors, and the like, and cabling or wires connecting the components thereof.

Transformer circuits 112-1 and 112-2 (collectively transformer circuits 112) may include transformer circuitry to provide a power interface between cable side circuits 113 and physical layer circuits 111. Transformer circuits 112 may include a transformer, a plurality of ports, and other electrical and electronic components. Physical layer circuits 111 may be coupled to transformer circuits 112 at a first set of the ports. Cable side circuits 113 may be coupled to transformer circuits 112 at a second set of the ports. Other sets of ports may also be included and used to couple transformer circuits 112 to other circuit components, such as a transient suppression diode (TVS) circuit. Using the ports, transformer circuits 112 can provide power to respective circuits and components.

Cable side circuits 113-1 and 113-2 (collectively cable side circuits 113) may be representative of circuitry capable of providing an interface between controller 105 and drive 106, and components thereof, and a cable (e.g., an unshielded Ethernet cable) connecting network interface systems 110 to network 115. Cable side circuits 113 may include various electrical and electronic components, such as resistors, capacitors, inductors, and the like, and cabling or wires connecting the components thereof.

In various examples, cable side circuits 113 may include an interference dissipation circuit capable of dissipating common-mode impedance interference, among other types of interference, introduced to network interface systems 110 via a communication cable coupled to ports of cable side circuits 113. The interference dissipation circuit may include one or more variable resistors coupled in series with one or more capacitors. The resistance of the one or more variable resistors may be selected manually or automatically based on an identified amount of common-mode impedance interference at a given time. In a first example, a user may measure an amount of interference within a frequency range and manually adjust the value of the variable resistors, such as by tuning the resistors via a potentiometer, a rotary switch, or by another means. In a second example, network interface systems 110 may include a controller (not shown) capable of identifying the amount of interference within a frequency range and changing the value of the variable resistors (e.g., electrically-tuned resistors) to reduce the interference.

Network interface systems 110 may be coupled to network 115 at cable side circuits 113 of network interface systems 110 via physical connections. The physical connections may be made using low-voltage cabling and connectors and receptacles at both cable side circuits 113 and network 115. In an example, cable side circuits 113 may include receptacles for coupling with Registered Jack-45 (RJ45) connectors of Ethernet cabling. Each pair of wires of an Ethernet cable may be coupled to a different receptacle or port of cable side circuits 113. In various examples, the Ethernet cabling may include any number of pairs. Other connectors may also be used.

Network 115 may be representative of a communication network established in an industrial automation environment via one or more communication protocols. When controller 105 and drive 106 are connected to network 115 via network interface systems 110-1 and 110-2, respectively, controller 105 and drive 106 may communicate with each other and with other devices 120 in an industrial automation environment also connected to network 115.

Devices 120 may be representative of any devices, systems, circuits, or components in an industrial automation environment. Examples of devices 120 may include actuators, sensors, drives, motors, belts, controllers, and more. In this example, devices 120 may not include a network interface system like controller 105 or drive 106.

Figure 2:
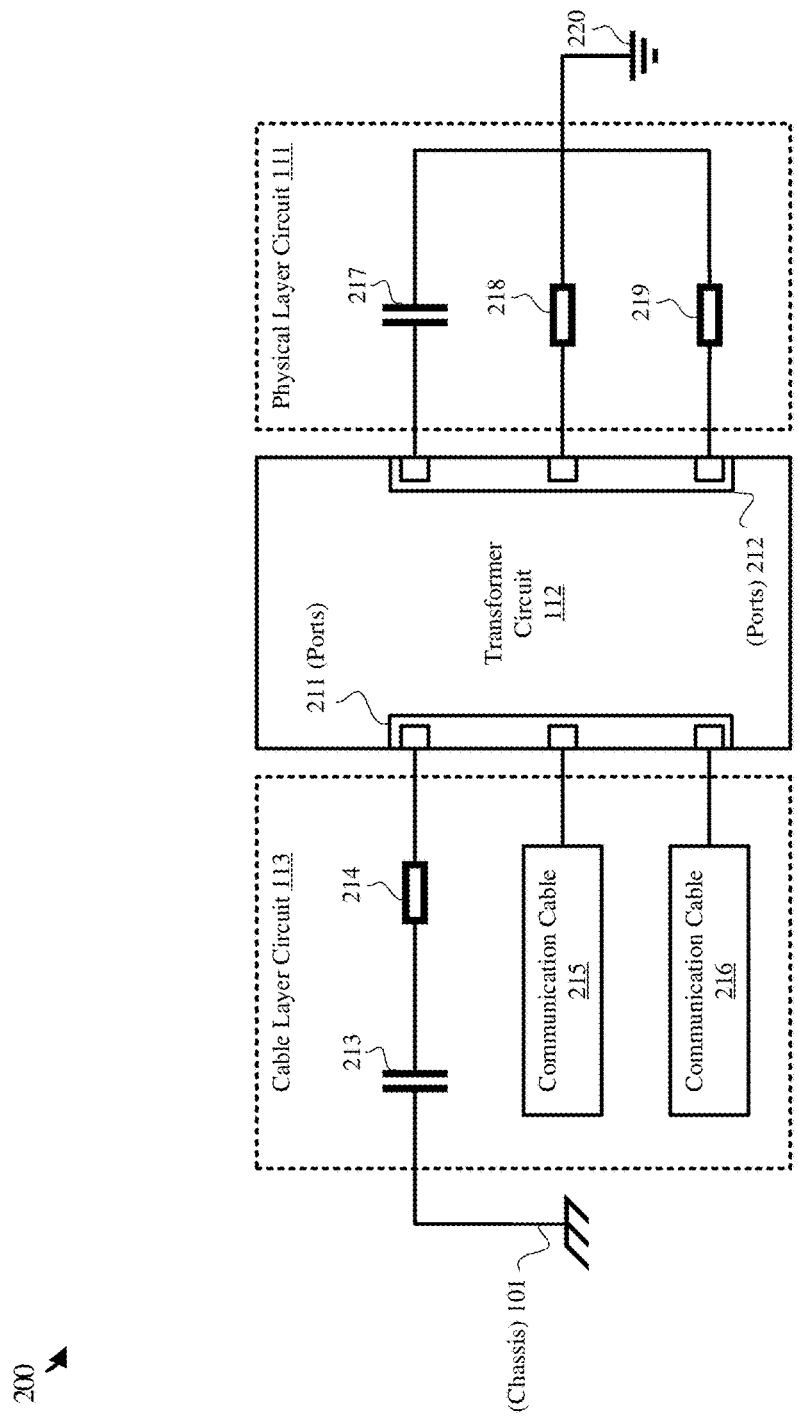
FIG. 2 illustrates an example block diagram of a network interface system in accordance with some embodiments of the present technology.

FIG. 2 illustrates an example block diagram of a network interface system in accordance with some embodiments of the present technology. FIG. 2 includes network interface system 200, which includes chassis 101, physical layer circuit 111, transformer circuit 112, cable side circuit 113, and ground node 220. Network interface system 200 may be representative of and include components of network interface system 110 of FIG. 1.

Network interface system 200 may be representative of one or more devices, circuits, and components capable of connecting an industrial or commercial device (e.g., controller 105, drive 106) to a communication network (e.g., network 115) and protecting a connected device from electrical interference, such as common-mode impedance interference. In various examples, network interface system 200 may be implemented in or around a port, coupling, receptacle, or other interface device of an industrial device, such as in or around an RJ45 connector of the industrial device.

Physical layer circuit 111 may be representative of circuitry capable of providing a physical layer (PHY) interface between the communication network or a network device (e.g., a switch) connected to the communication network and components of an industrial device in which physical layer circuit 111, transformer circuit 112, and cable side circuit 113 may be included, such as a controller (e.g., controller 105), a drive (e.g., drive 106), or another industrial or commercial device. Physical layer circuits 111 may include various electrical and electronic components, such as resistors, capacitors, inductors, and the like, and cabling or wires connecting the components thereof.

More specifically, physical layer circuit 111 includes capacitor 217, resistor 218, and resistor 219. Each of capacitor 217, resistor 218, and resistor 219 may have respective characteristic values based on desired performance of physical layer circuit 111. In one example, capacitor 217 may have a capacitance of 0.1 microfarads and resistors 218 and 219 may have resistances of 50 Ohms. Each of capacitor 217, resistor 218, and resistor 219 have first terminals and second terminals. A first terminal of capacitor 217 may be coupled to a first port of ports 212 of transformer circuit 112, and a second terminal of capacitor 217 may be coupled to ground node 220. A first terminal of resistor 218 may be coupled to a second port of ports 212 of transformer circuit 112, and a second terminal of resistor 218 may be coupled to ground node 220. A first terminal of resistor 219 may be coupled to a third port of ports 212 of transformer circuit 112, and a second terminal of resistor 219 may be coupled to ground node 220.

Transformer circuit 112 may include transformer circuitry to provide a power interface between cable side circuit 113 and physical layer circuit 111. Transformer circuit 112 may include a transformer, a plurality of ports 211 and 212, and other electrical and electronic components. A first set of ports, ports 211, may include receptacles or connection points at which components of cable side circuit 113 may be connected. A second set of ports, ports 212, may include receptacle or connection points at which components of physical layer circuit 111 may be connected. In an example, physical layer circuit 111 may be coupled to transformer circuit 112 at ports 212 as described above, and cable side circuit 113 may be coupled to transformer circuit 112 at ports 211. Other sets of ports may also be included and used to couple transformer circuit 112 to other circuit components, such as a transient suppression diode (TVS) circuit (not shown). Transformer circuit 112 can provide power to respective circuits and components thereof via ports 211 and 212.

Cable side circuit 113 may be representative of circuitry capable of providing an interface between an industrial device, and components thereof, and communication cables 215 and 216 (e.g., an Ethernet cable having a pair of wires) connecting network interface system 200 to the communication network. Cable side circuit 113 may include various electrical and electronic components, such as resistors, capacitors, inductors, and the like, and cabling or wires connecting the components thereof.

More specifically, cable side circuit 113 includes capacitor 213, resistor 214, communication cable 215, and communication cable 216. Capacitor 213 and resistor 214 may have respective characteristic values based on desired performance of cable side circuit 113, or more particularly, based on an amount of interference occurring via signals passing through cable side circuit 113.

In one example, resistor 214 may include one or more variable resistors coupled together in series or in parallel. The resistance value of resistor 214 may be 75 Ohms by default, however, the resistance value may vary and may be changed manually or automatically. For example, resistor 214 may include a potentiometer or a rotary switch, which may be used to adjust the resistance of resistor 214. In another example, resistor 214 may include multiple resistors coupled together in a jumper formation. One of the resistors in the jumper formation may be selected at a time. In yet another example, resistor 214 may be an electrically-tunable resistor that can be adjusted on-the-fly during operation. In such examples, a further circuit may be included in network interface system 200 that is capable of identifying an amount of interference and the frequency range of the interference and tuning resistor 214 based on the amount of the interference and the frequency range of the interference. The capacitance of capacitor 213 may be 0.001 microfarads in some examples, however, the capacitance may be based on the value of resistor 214.

Regardless of implementation, capacitor 213 and resistor 214 may each include a first terminal and a second terminal. A first terminal of resistor 214 may be coupled to transformer circuit 112 at a first port of ports 211, and a second terminal of resistor 214 may be coupled to capacitor 213 at a first terminal of capacitor 213. The second terminal of capacitor 213 may be coupled to chassis 101. Accordingly, capacitor 213 and resistor 214 may be coupled in series with each other.

Communication cables 215 and 216 may be representative of low-voltage cables that can couple the industrial device to the communication network via communication equipment (e.g., a switch, a router). In various examples, communication cables 215 and 216 may be first and second pairs of wires in a single Ethernet cable. However, in other examples, communication cables 215 and 216 may be separate Ethernet cables including any number of pairs of wires. Communication cable 215 may include a first connector (e.g., an RJ45 connector) coupled to a second port of ports 211 of transformer circuit 112 and a second connector coupled to a communication device connected to the communication network. Communication cable 216 may include a first connector (e.g., an RJ45 connector) coupled to a third port of ports 211 of transformer circuit 112 and a second connector coupled to a communication device connected to the communication network. In some examples, communication cables 215 and 216 are connected to the same communication device, however, in other examples, communication cables 215 and 216 are connected to different communication devices.

In operation, signals may travel from cable side circuit 113 to transformer circuit 112 and to physical layer circuit 111 and from physical layer circuit 111 to transformer circuit 112 to cable side circuit 113. Transients or interference bursts may be injected into network interface system 200 from an external source or from communication cables 215 and 216 during operation. The first port of ports 211 of transformer circuit 112 may be a grounding port coupled to chassis 101, a protecting ground node, through resistor 214 and capacitor 213. When such transients or bursts occur, interference may flow to the grounding port to chassis 101. Chassis 101 may act as an energy bounce-back source if such interference is not dissipated through resistor 214 and capacitor 213, which may interfere with operations of the industrial device and damage components of the industrial device. Accordingly, resistor 214 and capacitor 213 may function as a common-mode interference dissipation circuit configured to reduce common-mode impedance interference introduced to network interface system 200.

More particularly, characteristic values of resistor 214 and capacitor 213 may be selected to match an impedance value of the common-mode impedance interference at or within a frequency range, such that when an interference signal passes through resistor 214 and capacitor 213, the common-mode impedance interference dissipates. Importantly, because resistor 214 includes one or more variable resistors, the resistance value or resistor 214 may be dynamically adjusted to match the impedance value of the interference signal passing through ports 211 to chassis 101. Advantageously, variable resistors may improve common-mode impedance interference dissipation over various frequency ranges as the resistance value(s) may be dynamically, automatically or manually, adjusted based on an amount of interference. This may not only improve design performance by reducing noise in a system or device, but also reduce re-design of a system by allowing the system to adjust on-the-fly by changing resistance of resistor 214.

Figure 3A:
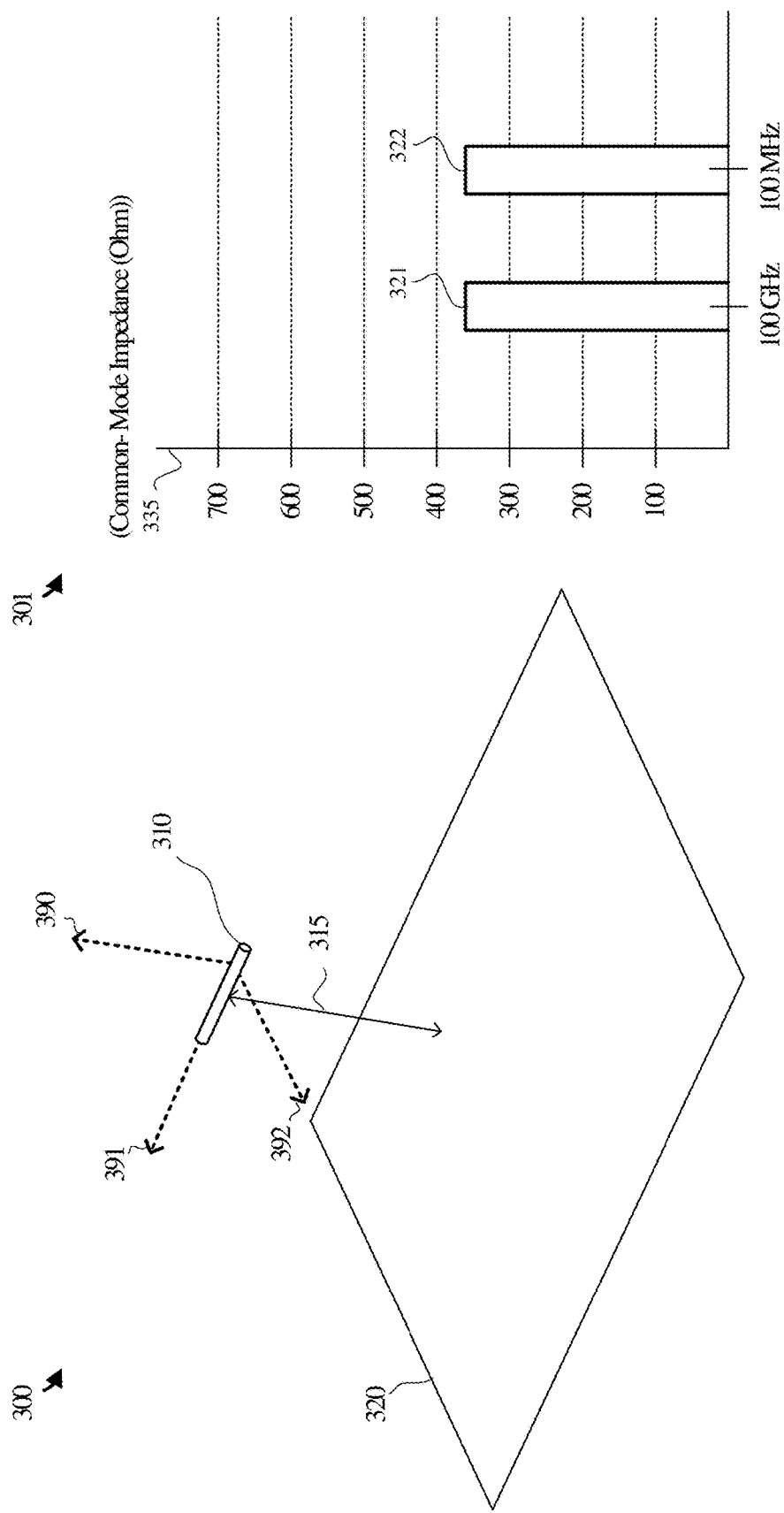
FIGS. 3A, 3B, 3C, 3D, and 3E illustrate example aspects and graphical representations corresponding to elements of a network interface system in accordance with some embodiments of the present technology.
Figure 3B:
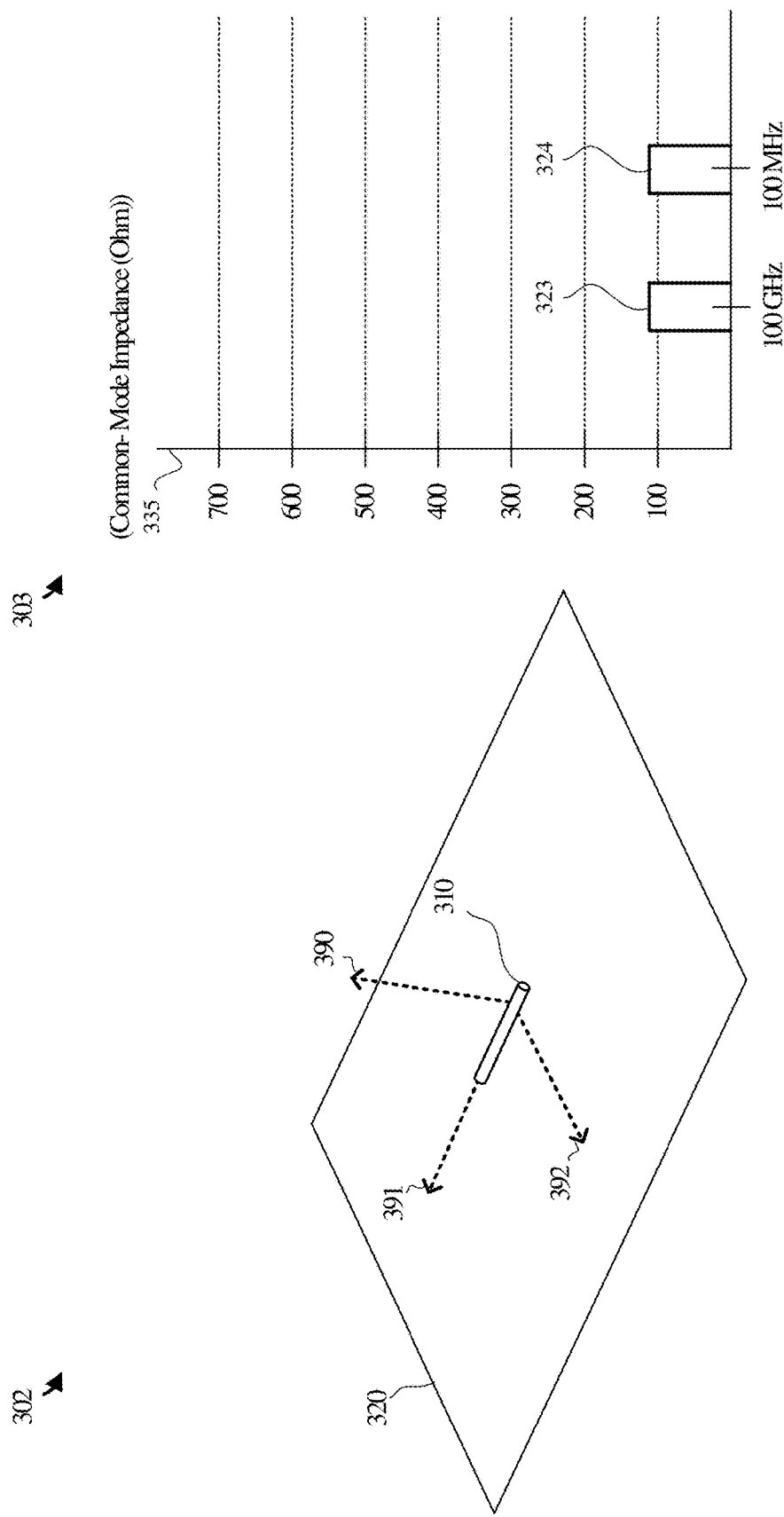
Figure 3C:
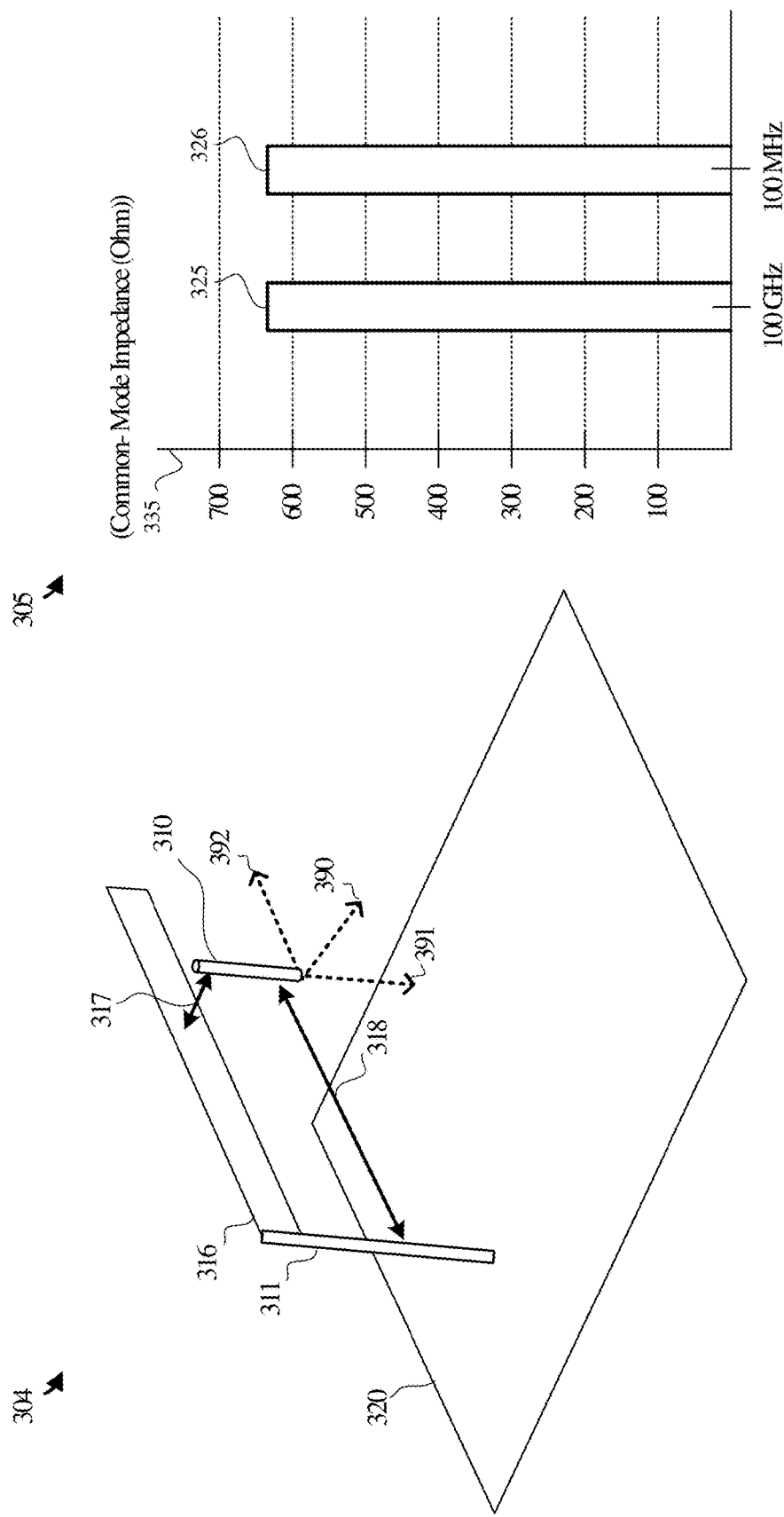
Figure 3D:
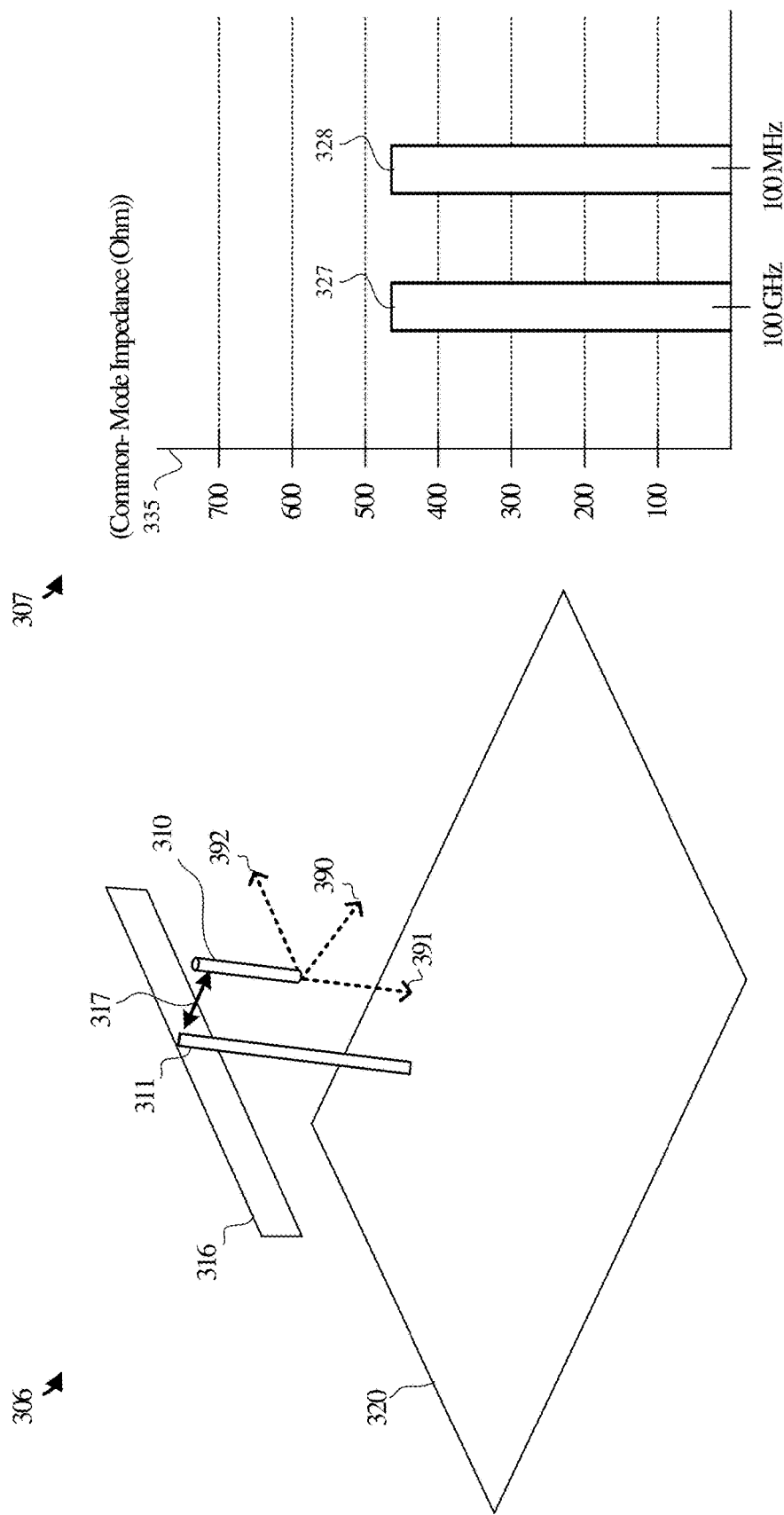
Figure 3E:
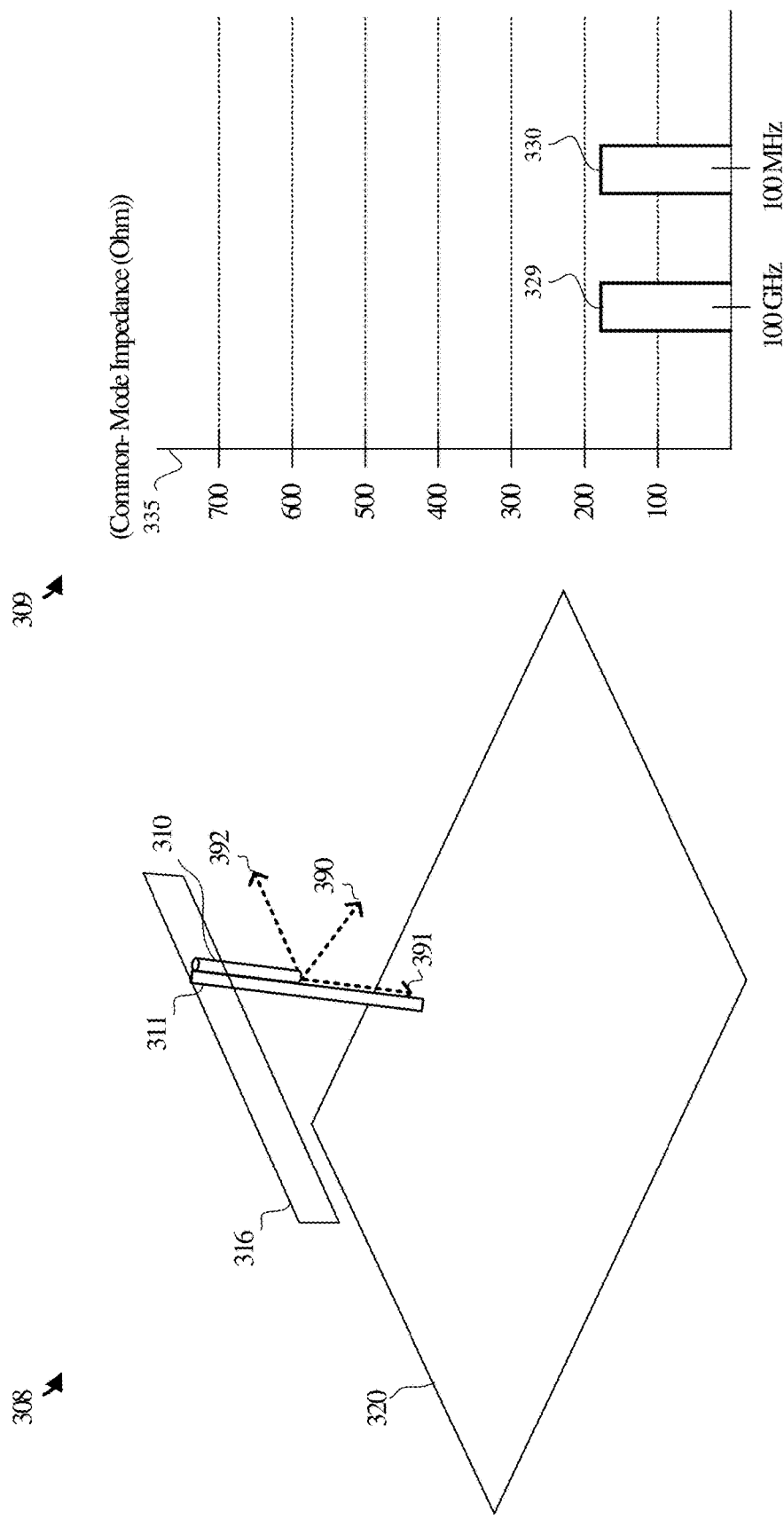

FIGS. 3A, 3B, 3C, 3D, and 3E illustrate example aspects and graphical representations corresponding to elements of a network interface system in accordance with some embodiments of the present technology. FIG. 3A includes operating environment 300 and graphical representation 301. FIG. 3B includes operating environment 302 and graphical representation 303. FIG. 3C includes operating environment 304 and graphical representation 305. FIG. 3D includes operating environment 306 and graphical representation 307. FIG. 3E includes operating environment 308 and graphical representation 309.

Referring first to FIG. 3A, operating environment 300 includes cable 310 and chassis 320. In this example, cable 310 is positioned a distance 315 from chassis 320 and in parallel with chassis 320 with respect to z-axis 390 of a coordinate frame including y-axis 390, z-axis 391, and x-axis 392.

Cable 310 may be representative of a low-voltage cable or wire that may include a first end and a second end, such as an Ethernet cable. Each end may include a connector or coupler attached to it, such as an RJ45 connector. Cable 310 may connect to a network interface system (e.g., network interface system 110-1) coupled to chassis 320 at the first end via a first RJ45 connector and to a network device (e.g., a switch) at the second end via a second RJ45 connector.

Chassis 320 may be representative of a structural framework, rack, or other support device that can include internal and external supporting structures on which industrial, commercial, and industrial automation devices can be mounted, attached, placed, or otherwise affixed to (e.g., chassis 101, chassis 102). Chassis 320 can provide protective grounding for electrical signals transmitted to and received from devices in or on chassis 320. In an example, chassis 320 may include a controller (e.g., controller 105) that may be used to control operations of an industrial or commercial device, such as a drive. In other examples, additional or different devices may be included in chassis 320, such as network controllers, logic controllers, I/O modules and adapters, chassis-based communication modules, Ethernet IP adapters, network cards, other networking equipment, and the like.

When cable 310 is positioned horizontally with respect to z-axis 391 a distance 315 from chassis 320, as in operating environment 300, an amount of common-mode impedance may be present in a signal traveling through cable 310 to or from the network interface system or the network device.

FIG. 3A also includes graphical representation 301. Graphical representation 301 shows measurements 321 and 322 associated with cable 310 with respect to common-mode impedance 335. In this example, when cable 310 is positioned in such a way as illustrated in operating environment 300, measurement 321 may be a value of approximately 355 Ohms at a frequency of 1 GHz, and measurement 322 may be a value of approximately 355 Ohms at a frequency of 100 MHz. Accordingly, a common-mode impedance dissipation circuit, such as one of cable side circuit 113 of network interface system 110 of FIG. 1, may include one or more variable resistors tuned to approximately 355 Ohms to reduce and dissipate an amount of interference corresponding to measurements 321 and 322.

Referring next to FIG. 3B, operating environment 302 includes cable 310 and chassis 320. In this example, cable 310 is physically coupled, attached, on-top, or otherwise affixed to chassis 320. More specifically, cable 310 is positioned horizontally with respect to z-axis 391 on top of chassis 320. In this position, an amount of common-mode impedance may be present in a signal traveling through cable 310 to or from the network interface system or the network device as illustrated by graphical representation 303.

Graphical representation 303 shows measurements 323 and 324 associated with cable 310 with respect to common-mode impedance 335. In this example, when cable 310 is positioned in such a way as illustrated in operating environment 302, measurement 323 may be a value of approximately 100 Ohms at a frequency of 1 GHz, and measurement 324 may be a value of approximately 100 Ohms at a frequency of 100 MHz. Accordingly, a common-mode impedance dissipation circuit, such as one of cable side circuit 113 of network interface system 110 of FIG. 1, may include one or more variable resistors tuned to approximately 100 Ohms to reduce and dissipate an amount of interference corresponding to measurements 323 and 324.

Referring next to FIG. 3C, operating environment 304 includes cable 310, cable 311, mounting plate 316, and chassis 320. In this example, cable 310 is positioned a distance 317 from mounting plate 316 and a distance 318 from cable 311 (i.e., another low-voltage cable). In this example, cable 310 is positioned perpendicularly to chassis 320 with respect to y-axis 390 and in parallel to cable 311 with respect to z-axis 391. In this position, an amount of common-mode impedance may be present in a signal traveling through cable 310 to or from the network interface system or the network device as illustrated by graphical representation 305.

Graphical representation 305 shows measurements 325 and 326 associated with cable 310 with respect to common-mode impedance 335. In this example, when cable 310 is positioned in such a way as illustrated in operating environment 304, measurement 325 may be a value of approximately 610 Ohms at a frequency of 1 GHz, and measurement 326 may be a value of approximately 610 Ohms at a frequency of 100 MHz. Accordingly, a common-mode impedance dissipation circuit, such as one of cable side circuit 113 of network interface system 110 of FIG. 1, may include one or more variable resistors tuned to approximately 610 Ohms to reduce and dissipate an amount of interference corresponding to measurements 325 and 326.

Referring next to FIG. 3D, operating environment 306 includes cable 310, cable 311, mounting plate 316, and chassis 320. Cable 310 is positioned a distance 317 from mounting plate 316 and from cable 311, which may be affixed to mounting plate 316. In this example, cable 310 is positioned perpendicularly to chassis 320 with respect to y-axis 390 and in parallel to cable 311 with respect to z-axis 391. In this position, an amount of common-mode impedance may be present in a signal traveling through cable 310 to or from the network interface system or the network device as illustrated by graphical representation 307.

Graphical representation 307 shows measurements 327 and 328 associated with cable 310 with respect to common-mode impedance 335. In this example, when cable 310 is positioned in such a way as illustrated in operating environment 306, measurement 327 may be a value of approximately 450 Ohms at a frequency of 1 GHz, and measurement 328 may be a value of approximately 450 Ohms at a frequency of 100 MHz. Accordingly, a common-mode impedance dissipation circuit, such as one of cable side circuit 113 of network interface system 110 of FIG. 1, may include one or more variable resistors tuned to approximately 450 Ohms to reduce and dissipate an amount of interference corresponding to measurements 327 and 328.

Referring lastly to FIG. 3E, operating environment 308 includes cable 310, cable 311, mounting plate 316, and chassis 320. Cable 310 and cable 311 may be coupled to each other and mounted on mounting plate 316. In this example, cable 310 is positioned perpendicularly to chassis 320 with respect to y-axis 390 and in parallel to cable 311 with respect to z-axis 391. In this position, an amount of common-mode impedance may be present in a signal traveling through cable 310 to or from the network interface system or the network device as illustrated by graphical representation 309.

Graphical representation 309 shows measurements 329 and 330 associated with cable 310 with respect to common-mode impedance 335. In this example, when cable 310 is positioned in such a way as illustrated in operating environment 308, measurement 329 may be a value of approximately 165 Ohms at a frequency of 1 GHz, and measurement 330 may be a value of approximately 165 Ohms at a frequency of 100 MHz. Accordingly, a common-mode impedance dissipation circuit, such as one of cable side circuit 113 of network interface system 110 of FIG. 1, may include one or more variable resistors tuned to approximately 165 Ohms to reduce and dissipate an amount of interference corresponding to measurements 329 and 330.

Figure 4:
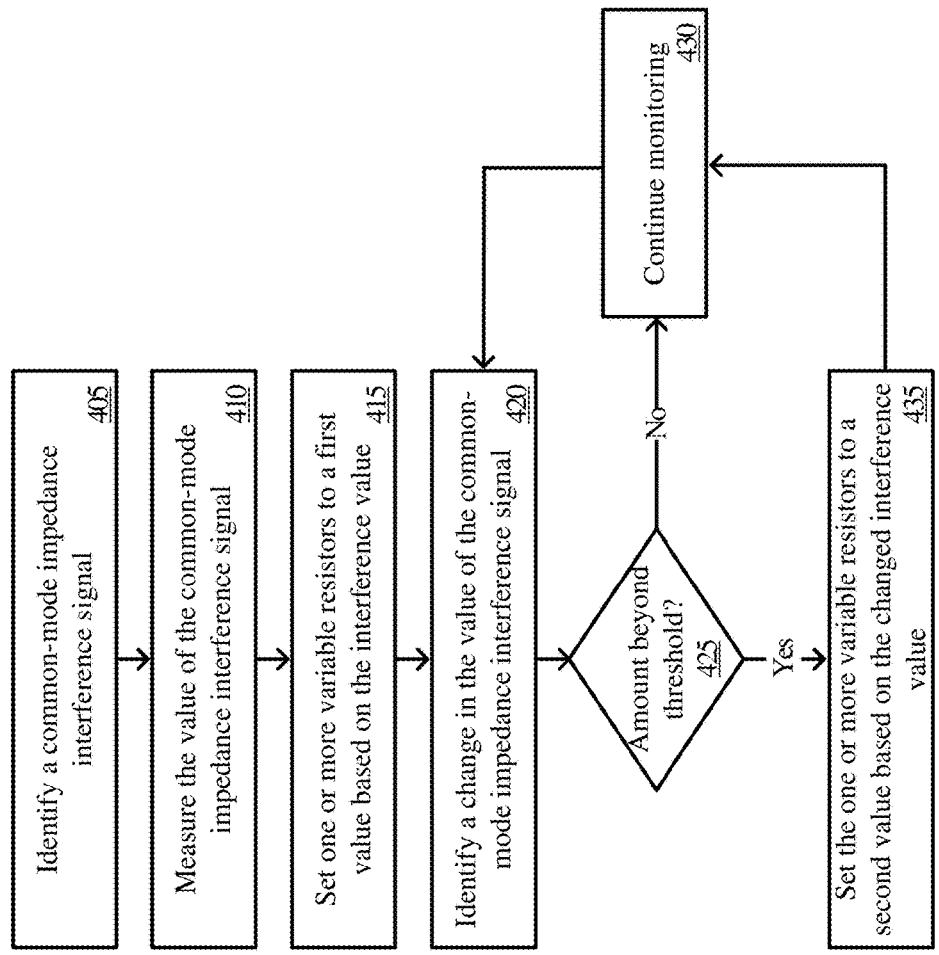
FIG. 4 illustrates an example set of operations for adjusting resistor values based on measured interference in accordance with some embodiments of the present technology.

FIG. 4 illustrates an example set of operations for adjusting resistor values based on measured interference in accordance with some embodiments of the present technology. FIG. 4 includes process 400 described below, which refers to elements of FIGS. 1 and 2. In various examples, process 400 may be implemented by hardware, software, firmware, or any combination or variation thereof. For example, a network interface system or a component of a cable side circuit thereof, such as network interface system 110-1 and cable side circuit 113-1, may perform process 400.

In operation 405, an interference detection circuit can identify a common-mode impedance interference signal. The common-mode impedance interference signal may be a transient or burst that can reach a network interference system 110-1 or a device that includes the network interference system (e.g., controller 105) via communication cables 215 and 216. If the common-mode impedance interference signal is not dissipated, network interference system 110-1 or the device, among other elements in an environment may be disrupted or damaged.

In operation 410, the interference detection circuit measures the value of the common-mode impedance interference signal. In various examples, the interference detection circuit may include one or more sensors that can measure the impedance of common-mode impedance interference signals. Based on the measured value, the interference detection circuit, in operation 415, can set variable resistor 214 to a first value. In some examples where variable resistor 214 includes a network of variable resistors, among other implementations, the interference detection circuit can set one or more of the resistance values of the variable resistors based on the measured impedance.

Next, in operation 420, the interference detection circuit monitors for changes in impedance, and in response to identifying a change in impedance value, the interference detection circuit can determine whether the amount has changed beyond a threshold value in operation 425. In various examples, multiple threshold values may be predetermined based on the capabilities of variable resistor 214. By way of example, the first value of variable resistor 214 may be 75 Ohms. When the interference detection circuit determines that the impedance of the common-mode impedance interference signal increases above a threshold (e.g., approximately 75 Ohms) to approximately 150 Ohms, the interference detection circuit can set variable resistor 214 to a second value (e.g., 150 Ohms) to match the impedance of the interference signal and dissipate the interference in operation 435. However, if the impedance has not increased or decreased beyond a threshold amount, the interference detection circuit, in operation 430, can continue monitoring for changes in impedance value. After changing the value of variable resistor 214, the interference detection circuit may also perform operation 430 to continuing monitoring and adjusting the values of variable resistor 214 accordingly.

Figure 5:
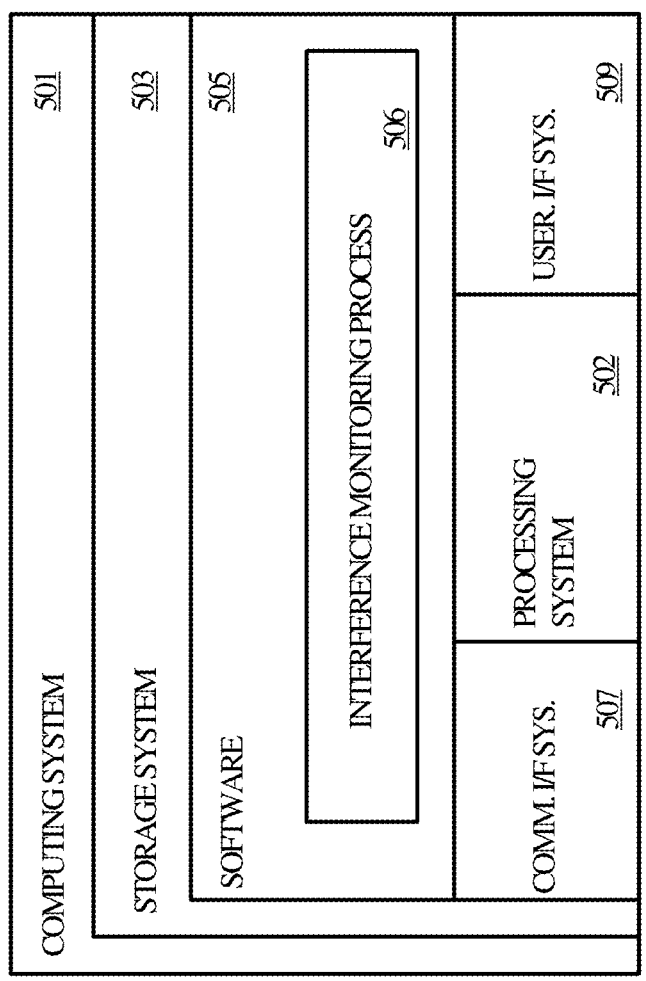
FIG. 5 illustrates an example computing system used in some embodiments of the present technology.

FIG. 5 illustrates computing system 501 to perform device health metric contextualization and classification, according to an implementation of the present technology. Computing system 501 is representative of any system or collection of systems with which the various operational architectures, processes, scenarios, and sequences disclosed herein for monitoring interference and adjusting resistor values to account for measured interference may be employed. Computing system 501 may be implemented as a single apparatus, system, or device or may be implemented in a distributed manner as multiple apparatuses, systems, or devices. Computing system 501 includes, but is not limited to, processing system 502, storage system 503, software 505, communication interface system 507, and user interface system 509 (optional). Processing system 502 is operatively coupled with storage system 503, communication interface system 507, and user interface system 509. Computing system 501 may be representative of a cloud computing device, distributed computing device, or the like.

Processing system 502 loads and executes software 505 from storage system 503. Software 505 includes and implements interference monitoring process 506, which is representative of any of the interference measuring and sensing, impedance measuring and sensing, resistance adjusting, and other processes discussed with respect to the preceding Figures. When executed by processing system 502 to provide resistance adjustment functions, software 505 directs processing system 502 to operate as described herein for at least the various processes, operational scenarios, and sequences discussed in the foregoing implementations. Computing system 501 may optionally include additional devices, features, or functionality not discussed for purposes of brevity.

Referring still to FIG. 5, processing system 502 may comprise a micro-processor and other circuitry that retrieves and executes software 505 from storage system 503. Processing system 502 may be implemented within a single processing device but may also be distributed across multiple processing devices or sub-systems that cooperate in executing program instructions. Examples of processing system 502 include general purpose central processing units, graphical processing units, application specific processors, and logic devices, as well as any other type of processing device, combinations, or variations thereof.

Storage system 503 may comprise any computer readable storage media readable by processing system 502 and capable of storing software 505. Storage system 503 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 503 may also include computer readable communication media over which at least some of software 505 may be communicated internally or externally. Storage system 503 may be implemented as a single storage device but may also be implemented across multiple storage devices or sub-systems co-located or distributed relative to each other. Storage system 503 may comprise additional elements, such as a controller capable of communicating with processing system 502 or possibly other systems.

Software 505 (including interference monitoring process 506) may be implemented in program instructions and among other functions may, when executed by processing system 502, direct processing system 502 to operate as described with respect to the various operational scenarios, sequences, and processes illustrated herein. For example, software 505 may include program instructions for implementing an interference monitoring process as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 505 may include additional processes, programs, or components, such as operating system software, virtualization software, or other application software. Software 505 may also comprise firmware or some other form of machine-readable processing instructions executable by processing system 502.

In general, software 505 may, when loaded into processing system 502 and executed, transform a suitable apparatus, system, or device (of which computing system 501 is representative) overall from a general-purpose computing system into a special-purpose computing system customized to provide device health metrics and contextualization and instantiation thereof as described herein. Indeed, encoding software 505 on storage system 503 may transform the physical structure of storage system 503. The specific transformation of the physical structure may depend on various factors in different implementations of this description. Examples of such factors may include, but are not limited to, the technology used to implement the storage media of storage system 503 and whether the computer-storage media are characterized as primary or secondary storage, as well as other factors.

For example, if the computer readable storage media are implemented as semiconductor-based memory, software 505 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 507 may include communication connections and devices that allow for communication with other computing systems (not shown) over communication networks (not shown). Examples of connections and devices that together allow for inter-system communication may include network interface cards, antennas, power amplifiers, radiofrequency circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing system 501 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of networks, or variation thereof. The aforementioned communication networks and protocols are well known and need not be discussed at length here.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112 (f) will begin with the words "means for" but use of the term "for" in any other context is not intended to invoke treatment under 35 U.S.C. § 112 (f). Accordingly, the applicant reserves the right to pursue additional claims after filing this application to pursue such additional claim forms, in either this application or in a continuing application.

What is claimed is:

1. A network interface component, comprising:
    a transformer circuit comprising a plurality of ports including a first set of ports and a second set of ports;
    a physical layer circuit coupled to the transformer circuit at the second set of ports; and
    a cable side circuit coupled to the transformer circuit at the first set of ports, wherein the cable side circuit comprises:
        a connector port comprising:
            a receptacle; and
            a set of output ports that couple to a subset of the first set of ports; and
        a common-mode interference dissipation circuit comprising:
            one or more variable resistors each having a first terminal and a second terminal; and
            a capacitor coupled in series with the one or more variable resistors and having a first terminal and a second terminal;
            wherein the first terminal of the one or more variable resistors is coupled to a port of the first set of ports, the second terminal of the one or more variable resistors is coupled to the first terminal of the capacitor, and the second terminal of the capacitor is coupled to a chassis in an industrial automation environment.

2. The network interface component of claim 1, wherein the physical layer circuit comprises:
    a capacitor coupled to a first port of the second set of ports;
    a first resistor coupled to a second port of the second set of ports; and
    a second resistor coupled to a third port of the second set of ports; and
    wherein the capacitor, the first resistor, and the second resistor are coupled together at a ground node.

3. The network interface component of claim 2, wherein the capacitor of the physical layer circuit has a capacitance of approximately 0.1 microfarad.

4. The network interface component of claim 2, wherein the first resistor has a resistance of approximately 50 Ohms.

5. The network interface component of claim 2, wherein the second resistor has a resistance of approximately 50 Ohms.

6. The network interface component of claim 1, wherein:
    the one or more variable resistors comprise a selector knob, and
    a resistance value within a range of resistance values is selected via the knob.

7. The network interface component of claim 1, further comprising a jumper device, wherein:
    the one or more variable resistors comprises a group of resistors each having a different resistance value; and
    the resistors of the group of resistors are selectively coupled in series with the capacitor of the interference dissipation circuit based on a setting of the jumper device.

8. The network interface component of claim 1, wherein the receptacle receives a connector of an Ethernet cable in the industrial automation environment.

9. The network interface component of claim 8, wherein a value of the one or more variable resistors of the interference dissipation circuit is selected based on a common-mode impedance value of the Ethernet cable at the connector port.

10. The network interface component of claim 1, wherein the capacitor of the interference dissipation circuit has a capacitance of approximately 0.001 microfarad.

11. The network interface component of claim 1, wherein the network interface component is one of: a programmable logic controller (PLC), a drive, a chassis-based communication module, a network controller, an I/O module, and an Ethernet IP adaptor in the industrial automation environment.

12. An industrial automation system, comprising:
a network interface component; and
an industrial automation device coupled to the network interface component;
wherein the network interface component comprises:
a transformer circuit comprising a plurality of ports including a first set of ports and a second set of ports;
a physical layer circuit coupled to the transformer circuit at the second set of ports; and
a cable side circuit coupled to the transformer circuit at the first set of ports, wherein the cable side circuit comprises:
a connector port comprising:
a receptacle; and
a set of output ports that couple to a subset of the first set of ports; and
a common-mode interference dissipation circuit comprising:
one or more variable resistors each having a first terminal and a second terminal; and
a capacitor coupled in series with the one or more variable resistors and having a first terminal and a second terminal;
wherein the first terminal of the one or more variable resistors is coupled to a port of the first set of ports, the second terminal of the one or more variable resistors is coupled to the first terminal of the capacitor, and the second terminal of the capacitor is coupled to a chassis in an industrial automation environment.

13. The industrial automation system of claim 12, wherein the physical layer circuit comprises:
a capacitor coupled to a first port of the second set of ports;
a first resistor coupled to a second port of the second set of ports; and
a second resistor coupled to a third port of the second set of ports; and
wherein the capacitor, the first resistor, and the second resistor are coupled together at a ground node.

14. The industrial automation system of claim 13, wherein:
the capacitor of the physical layer circuit has a capacitance of approximately 0.1 uF;
the first resistor of the physical layer circuit has a resistance of approximately 50 Ohms; and
the second resistor of the physical layer circuit has a resistance of approximately 50 Ohms.

15. The industrial automation system of claim 12, wherein:
the one or more variable resistors comprise a selector knob, and
a resistance value within a range of resistance values is selected via the knob.

16. The industrial automation system of claim 12, further comprising a jumper device, wherein:
the one or more variable resistors comprises a group of resistors each having a different resistance value; and
the resistors of the group of resistors are selectively coupled in series with the capacitor of the interference dissipation circuit based on a setting of the jumper device.

17. The industrial automation system of claim 12, wherein the receptacle receives a connector of an Ethernet cable in the industrial automation environment.

18. The industrial automation system of claim 17, wherein a value of the one or more variable resistors of the interference dissipation circuit is selected based on a common-mode impedance value of the Ethernet cable at the connector port.

19. The industrial automation system of claim 12, wherein the capacitor of the interference dissipation circuit has a capacitance of approximately 0.001 microfarad.

20. The industrial automation system of claim 12, wherein the industrial automation device is one of: a programmable logic controller (PLC), a drive, a chassis-based communication module, a network controller, an I/O module, and an Ethernet IP adaptor in the industrial automation environment.

* * * * *